United States Patent
Zan et al.

(10) Patent No.: US 10,079,283 B2
(45) Date of Patent: Sep. 18, 2018

(54) MANUFACTURING METHOD OF A TRANSISTOR

(71) Applicant: E Ink Holdings Inc., Hsinchu (TW)

(72) Inventors: Hsiao-Wen Zan, Hsinchu (TW); Chuang-Chuang Tsai, Hsinchu (TW); Hsin Chiao, Hsinchu (TW); Wei-Tsung Chen, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 160 days.

(21) Appl. No.: 15/281,085

(22) Filed: Sep. 30, 2016

(65) Prior Publication Data

US 2017/0018616 A1  Jan. 19, 2017

Related U.S. Application Data (63) Continuation-in-part of application No. 14/789,975, filed on Jul. 1, 2015.

(30) Foreign Application Priority Data

Jul. 17, 2014  (TW) .............................. 103124570 A (51) Int. Cl.
*H01L 29/40* (2006.01)
*H01L 21/28* (2006.01)
(Continued)

(52) U.S. Cl.
CPC ........ *H01L 29/401* (2013.01); *C23C 18/1254* (2013.01); *H01L 21/28008* (2013.01); *H01L 21/845* (2013.01); *H01L 29/42376* (2013.01); *H01L 29/66795* (2013.01); *H01L 29/785* (2013.01)

(58) Field of Classification Search
None
See application file for complete search history.

(56) References Cited

U.S. PATENT DOCUMENTS

| 7,776,755 B2 | 8/2010 | Lin et al. |
| 8,030,718 B2 | 10/2011 | Huang et al. |

(Continued)

FOREIGN PATENT DOCUMENTS

| CN | 102315127 | 1/2012 |
| CN | 103325833 | 9/2013 |

OTHER PUBLICATIONS

Hench et al., "The sol-gel process," Chemical Reviews, Jan. 1990, pp. 32-72.

(Continued)

*Primary Examiner* — Tom Thomas
*Assistant Examiner* — Steven B Gauthier
(74) *Attorney, Agent, or Firm* — JCIPRNET (57) ABSTRACT

A manufacturing method of a transistor is provided, and the method includes: providing a base; forming a fin-shaped gate on the base; covering the fin-shaped gate with an insulation layer; providing a substrate; forming a partially cured sol-gel on the substrate; inserting the fin-shaped gate into the partially cured sol-gel, so that a portion of the fin-shaped gate is uncovered by the partially cured sol-gel; after inserting the fin-shaped gate into the partially cured sol-gel, curing the partially cured sol-gel; and processing a portion of the partially cured sol-gel not overlapping with the fin-shaped gate to increase conductivity of the portion of the partially cured sol-gel.

9 Claims, 10 Drawing Sheets

(51) Int. Cl.
    *H01L 29/423*     (2006.01)
    *H01L 29/66*     (2006.01)
    *H01L 29/78*     (2006.01)
    *H01L 21/84*     (2006.01)
    *C23C 18/12*     (2006.01)

(56) References Cited

U.S. PATENT DOCUMENTS

| | | |
|---|---|---|
| 8,258,587 B2 | 9/2012 | Masuoka et al. |
| 8,268,085 B2 | 9/2012 | Yeh et al. |
| 8,304,349 B2 | 11/2012 | Lin et al. |
| 8,389,359 B2 | 3/2013 | Teo et al. |
| 8,405,192 B2 | 3/2013 | Huang et al. |
| 8,598,653 B2 | 12/2013 | Juengling |
| 2010/0062591 A1 | 3/2010 | Lin et al. |
| 2010/0080914 A1 | 4/2010 | Forrest et al. |
| 2012/0104472 A1 | 5/2012 | Xu et al. |
| 2012/0112180 A1 | 5/2012 | Zan et al. |
| 2012/0248503 A1 | 10/2012 | Huo et al. |
| 2013/0020623 A1 | 1/2013 | Tsui et al. |
| 2013/0082304 A1 | 4/2013 | Liu et al. |
| 2013/0099282 A1 | 4/2013 | Chen et al. |
| 2013/0157431 A1 | 6/2013 | Tsai et al. |
| 2013/0161583 A1 | 6/2013 | Blomme et al. |
| 2013/0302976 A1 | 11/2013 | Tsai et al. |
| 2014/0015055 A1 | 1/2014 | Flachowsky et al. |

OTHER PUBLICATIONS

"Office Action of Taiwan Counterpart Application", dated Sep. 21, 2016, p. 1-p. 3.
"Office Action of China Counterpart Application," dated Oct. 30, 2017, p. 1-p. 6.

MANUFACTURING METHOD OF A TRANSISTOR

CROSS-REFERENCE TO RELATED APPLICATION

This application is a continuation-in-part application of and claims the priority benefit of a prior application Ser. No. 14/789,975, filed on Jul. 1, 2015. The prior application Ser. No. 14/789,975 claims the priority benefit of Taiwan application serial no. 103124570, filed on Jul. 17, 2014. The entirety of each of the above-mentioned patent applications is hereby incorporated by reference herein and made a part of this specification.

FIELD OF THE INVENTION

The invention relates to an electronic element and a manufacturing method thereof. More particularly, the invention relates to a transistor and a manufacturing method thereof.

DESCRIPTION OF RELATED ART

With development and maturation of modern semiconductor technologies, the integration level of the integrated circuit gradually increases, and dimensions of semiconductor devices are continuously reduced; therefore, it is rather difficult to improve the performance of transistors. To overcome said technical difficulties, various field effect transistors have been proposed.

Conventional oxide transistors are often metal oxide semiconductor field effect transistors (MOSFET) with flat channels. The reduced dimensions of the semiconductor devices unavoidably result in the reduction of the channel length. If the channel length of the MOSFET is reduced to a certain degree, various issues may arise, such as the short channel effects, the increasing sub-threshold swing, and so forth, which may lead to the decrease in the threshold voltage, the current leakage of devices, and power loss. To resolve said issues, a fin field effect transistor (FinFET) with the three-surface three-dimensional gate structure may be applied because the FinFET with the favorable gate controlling capability may be characterized by the short channel length.

SUMMARY OF THE INVENTION

The invention is directed to a manufacturing method of a transistor; by applying the manufacturing method, the transistor featuring exceptional performance may be formed through performing simple manufacturing steps.

The invention is further directed to a transistor that can be formed with ease and simultaneously characterized by exceptional performance.

In an embodiment of the invention, a manufacturing method of a transistor is provided, and the method includes: providing a base; forming a fin-shaped gate on the base; covering the fin-shaped gate with an insulation layer; providing a substrate; forming a partially cured sol-gel on the substrate; inserting the fin-shaped gate into the partially cured sol-gel, so that a portion of the fin-shaped gate is uncovered by the partially cured sol-gel; after inserting the fin-shaped gate into the partially cured sol-gel, curing the partially cured sol-gel; and processing a portion of the partially cured sol-gel not overlapping with the fin-shaped gate to increase conductivity of the portion of the partially cured sol-gel.

According to an embodiment of the invention, the manufacturing method further includes removing the base after inserting the fin-shaped gate into the partially cured sol-gel.

According to an embodiment of the invention, the fin-shaped gate has a groove, and the step of inserting the fin-shaped gate into the partially cured sol-gel includes placing the fin-shaped gate in an upside-down manner, causing an opening located at a top portion of the groove of the fin-shaped gate to face the partially cured sol-gel and inserting the fin-shaped gate into the partially cured sol-gel.

According to an embodiment of the invention, the groove is filled with a material of the partially cured sol-gel after the fin-shaped gate is inserted into the partially cured sol-gel.

According to an embodiment of the invention, the step of processing the portion of the partially cured sol-gel not overlapping with the fin-shaped gate to increase the conductivity of the portion of the partially cured sol-gel includes transforming the portion of the partially cured sol-gel not overlapping with the fin-shaped gate into a conductor.

According to an embodiment of the invention, the step of processing the portion of the partially cured sol-gel not overlapping with the fin-shaped gate to increase the conductivity of the portion of the partially cured sol-gel not overlapping with the fin-shaped gate includes processing the partially cured sol-gel not overlapping with the fin-shaped gate through plasma treatment.

According to an embodiment of the invention, the step of processing the portion of the partially cured sol-gel not overlapping with the fin-shaped gate to increase the conductivity of the portion of the partially cured sol-gel not overlapping with the fin-shaped gate includes processing the portion of the partially cured sol-gel not overlapping with the fin-shaped gate through insulation layer covering treatment.

According to an embodiment of the invention, the step of processing the portion of the partially cured sol-gel not overlapping with the fin-shaped gate to increase the conductivity of the portion of the partially cured sol-gel overlapping with the fin-shaped gate comprises processing the portion of the partially cured sol-gel not overlapping with the fin-shaped gate through ion implantation.

According to an embodiment of the invention, a method of curing the partially cured sol-gel comprises thermal curing or photocuring.

In an embodiment of the invention, a transistor including a substrate, a source, a drain, an active portion, a fin-shaped gate, and an insulation layer is provided. The source is located on the substrate. The drain is located on the substrate. The active portion connects the source and the drain. The fin-shaped gate wraps the active portion. A first portion of the insulation layer separates the fin-shaped gate from the active portion, a second portion of the insulation layer separates the fin-shaped gate from the substrate, a third portion of the insulation layer separates the fin-shaped gate from the source and from the drain, and a fourth portion of the insulation layer is located on a surface of the fin-shaped gate facing away from the active portion. Here, the insulation layer is integrally formed.

According to an embodiment of the invention, a material of the source, the drain, and the active portion of the transistor includes a metal oxide semiconductor.

According to an embodiment of the invention, the active portion, the source, and the drain of the transistor respectively have metal elements with individual molar percentages, an absolute value of a difference between a maximum molar percentage of one of the metal elements of the active portion and a maximum molar percentage of one of the metal elements of the source is smaller than 1%, and an absolute value of a difference between the maximum molar percentage of the one of the metal elements of the active portion and a maximum molar percentage of the metal element of the drain is smaller than 1%.

In an embodiment of the invention, a transistor including a substrate, a source, a drain, an active portion, a fin-shaped gate, and an insulation layer is provided. The source is located on the substrate. The drain is located on the substrate. The action portion connects the source and the drain. Here, the active portion, the source, and the drain respectively have metal elements with individual molar percentages, an absolute value of a difference between a maximum molar percentage of one of the metal elements of the active portion and a maximum molar percentage of one of the metal elements of the source is smaller than 1%, and an absolute value of a difference between the maximum molar percentage of the one of the metal elements of the active portion and a maximum molar percentage of one of the metal elements of the drain is smaller than 1%; The fin-shaped gate wraps the active portion. The insulation layer separates the fin-shaped gate from the active portion.

According to an embodiment of the invention, a material of the source, the drain, and the active portion of the transistor includes a metal oxide semiconductor.

According to an embodiment of the invention, a material of the fin-shaped gate of the transistor includes metal.

According to an embodiment of the invention, a material of the insulation layer of the transistor includes metal oxide.

According to an embodiment of the invention, the fin-shaped gate includes a groove, an opening located at a top portion of the groove faces the substrate, and the source and the drain are respectively connected to two opposite sides of the active portion.

In view of the above, according to the manufacturing method of the transistor described herein, the fin-shaped gate is inserted into the shapable metal oxide layer, the shapable metal oxide layer is cured, and conductivity of a portion of the shapable metal oxide layer exposed by the fin-shaped gate is increased; thereby, the FinFET characterized by great performance may be formed by performing simple manufacturing steps. In addition, the transistor described herein includes the fin-shaped gate that wraps the active portion, so as to reduce the channel length and thus increase the current; thereby, the capability of the gate for controlling the channel can be enhanced, the current leakage caused by the short channel effects can be reduced, and the resultant transistor can then be formed with ease.

Several exemplary embodiments accompanied with figures are described in detail below to further describe the invention in details.

DETAILED DESCRIPTION OF DISCLOSED EMBODIMENTS

Figure 1A:
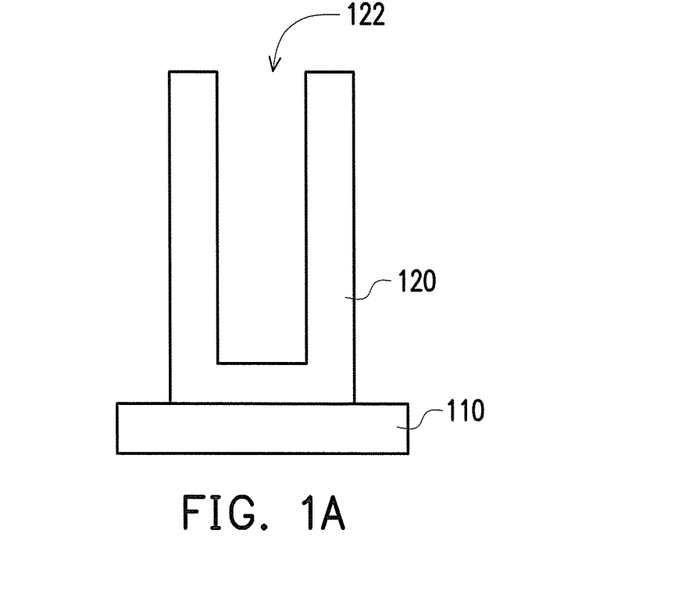
FIG. 1A to FIG. 1D and FIG. 1F to FIG. 1G are schematic diagrams sequentially illustrating steps of a manufacturing method of a transistor according to an embodiment of the invention.

FIG. 1A to FIG. 1D are schematic diagrams sequentially illustrating steps of a manufacturing method of a transistor according to an embodiment of the invention. In the present embodiment, a manufacturing method of a transistor 100 includes following steps. As shown in FIG. 1A, a base 110 is provided, and a fin-shaped gate 120 is formed on the base 110. The base 110 may be an insulation substrate, e.g., a glass substrate, a sapphire substrate, or a silicon substrate on which silicon oxide or any other insulation layer is grown. A material of the fin-shaped gate 120 includes metal, e.g., aluminum. The fin-shaped gate 120 further includes a groove 122, so as to form a U-shaped integral structure. Here, the groove 122 may be formed by photolithography and etching, imprint, or lift-off.

Figure 1B:
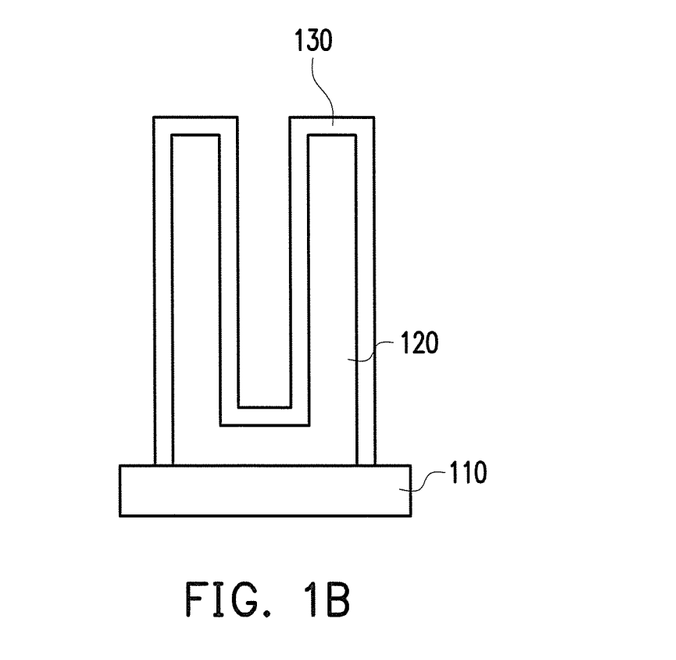

As shown in FIG. 1B, the fin-shaped gate 120 may be covered by an insulation layer 130 that may be formed by chemical vapor deposition (CVD), atomic layer deposition (ALD), or sputtering. Here, a material of the insulation layer 130 includes oxide, e.g., aluminum oxide ($Al_2O_3$).

Figure 1C:
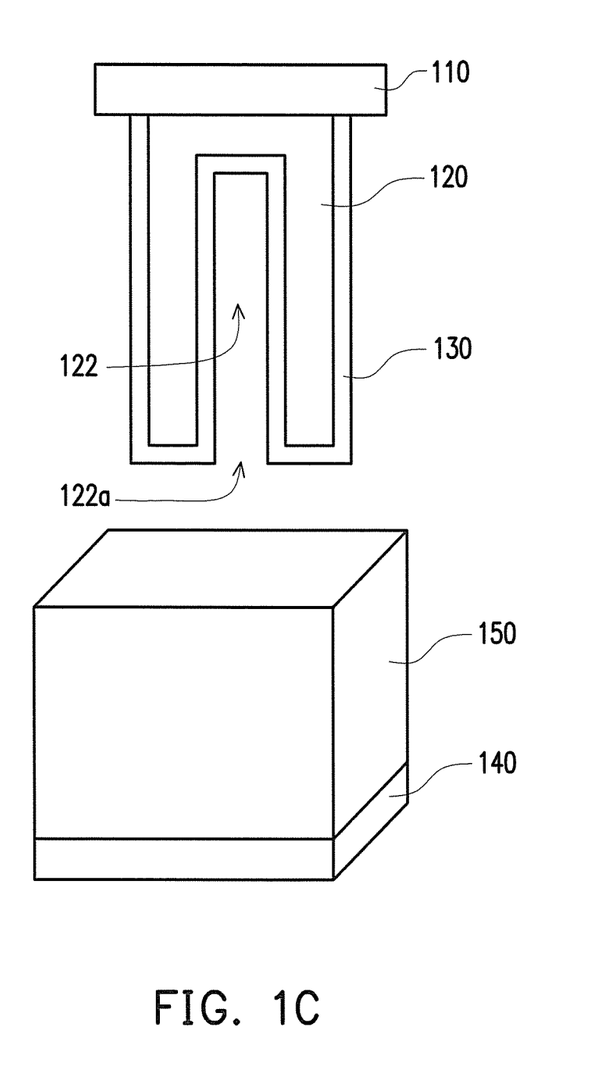

In the manufacturing method of the transistor 100 described herein, a substrate 140 is further provided, and a shapable metal oxide layer 150 is formed on the substrate 140, as shown in FIG. 1C. The substrate 140 may be an insulation substrate, e.g., a glass substrate, a sapphire substrate, or a silicon substrate on which silicon oxide or any other insulation layer is grown. A material of the shapable metal oxide layer 150 includes metal oxide, e.g., indium gallium zinc oxide (IGZO) which is characterized by plasticity and is not cured yet. A method of forming the shapable metal oxide layer 150 may include performing a sol-gel process to form a partially cured sol-gel, for instance.

Figure 1D:
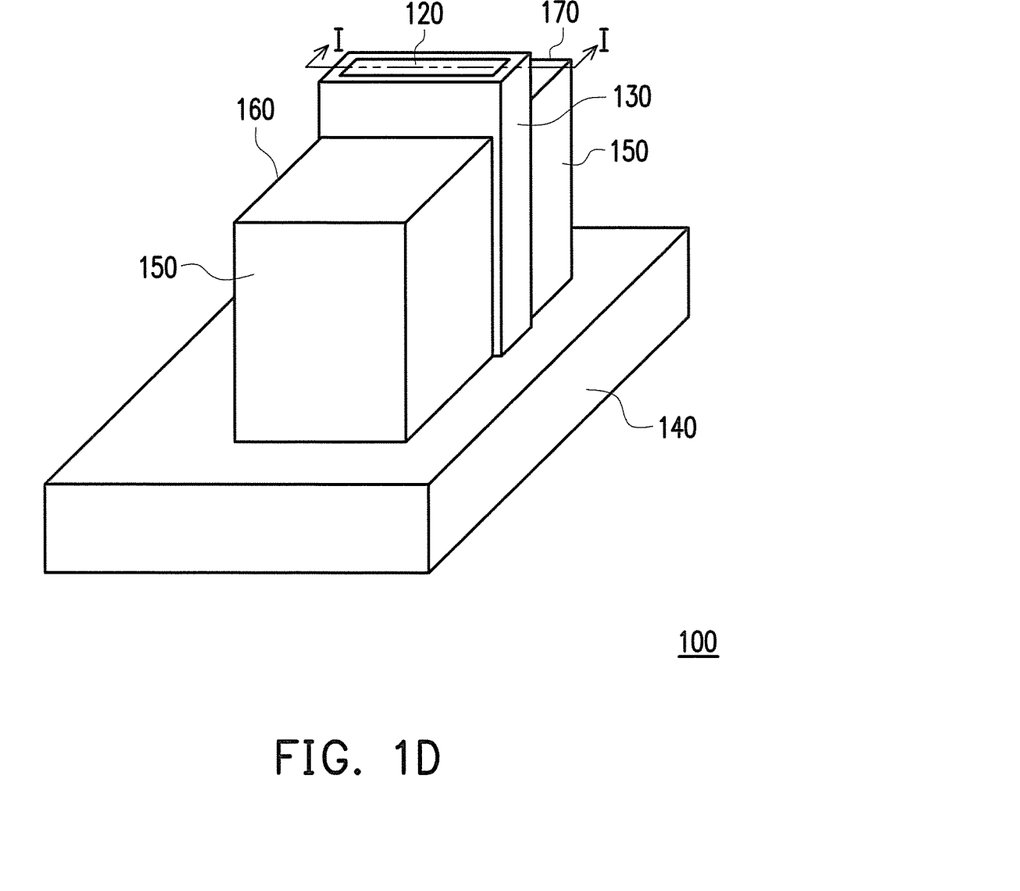

In the manufacturing method of the transistor 100 described herein, the fin-shaped gate 120 is inserted into the shapable metal oxide layer 150 by, for example, imprinting in a wet process, as shown in FIG. 1C and FIG. 1D. Note that the shapable metal oxide layer 150 is not completely cured during the insertion process (e.g., during the imprinting process). Besides, the step of inserting the fin-shaped gate 120 into the shapable metal oxide layer 150 includes placing the fin-shaped gate 120 in an upside-down manner (as shown in FIG. 1C), causing an opening located at a top portion of the groove 122 of the fin-shaped gate 120 to face the shapable metal oxide layer 150, and inserting the fin-shaped gate 120 into the shapable metal oxide layer 150.

As shown in FIG. 1D, after the fin-shaped gate 120 is inserted into the shapable metal oxide layer 150, the groove 122 is filled with a material of the shapable metal oxide layer 150. The portion of the shapable metal oxide layer 150 filling the groove 122 may serve as an active layer after a subsequent curing step is performed. After the fin-shaped gate 120 is inserted into the shapable metal oxide layer 150, the base 110 may be removed, so as to form a FinFET.

Figure 1E:
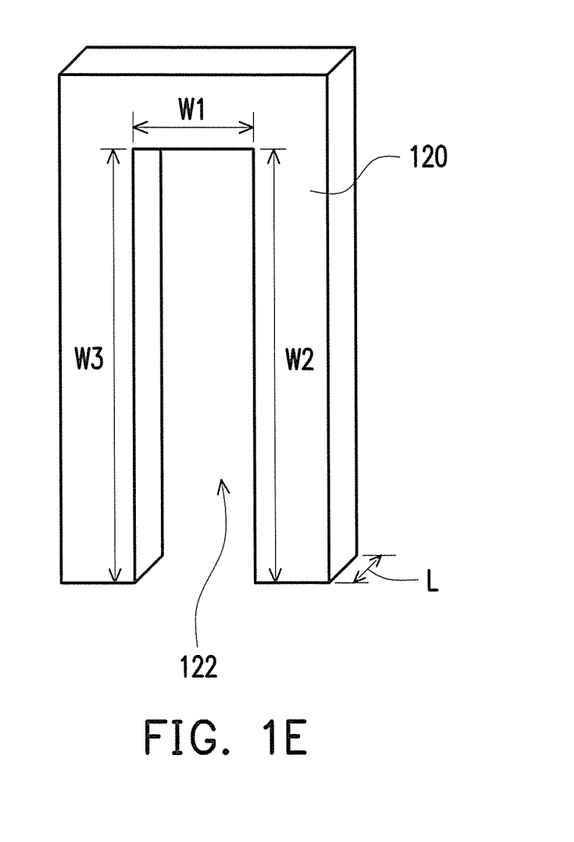
FIG. 1E is a schematic diagram illustrating the fin-shaped gate described in the embodiment depicted in FIG. 1A to FIG. 1D.

FIG. 1E is a schematic diagram illustrating the fin-shaped gate described in the embodiment depicted in FIG. 1A to FIG. 1D. According to the present embodiment, note that the lengths W1, W2, and W3 of the inner wall of the groove 122 of the fin-shaped gate 120 are the channel widths of the FinFET, and the width L of the groove 122 is the channel length of the FinFET. Hence, the fin-shaped gate 120 described in the present embodiment is able to lessen the short channel effects while the channel length is reduced, and the current can be simultaneously enhanced. Besides, the fin-shaped gate 120 described herein wraps the shapable metal oxide layer 150 acting as the active layer; hence, the transistor can have the favorable controlling capability, and the on/off state of the transistor is apparent.

Figure 1F:
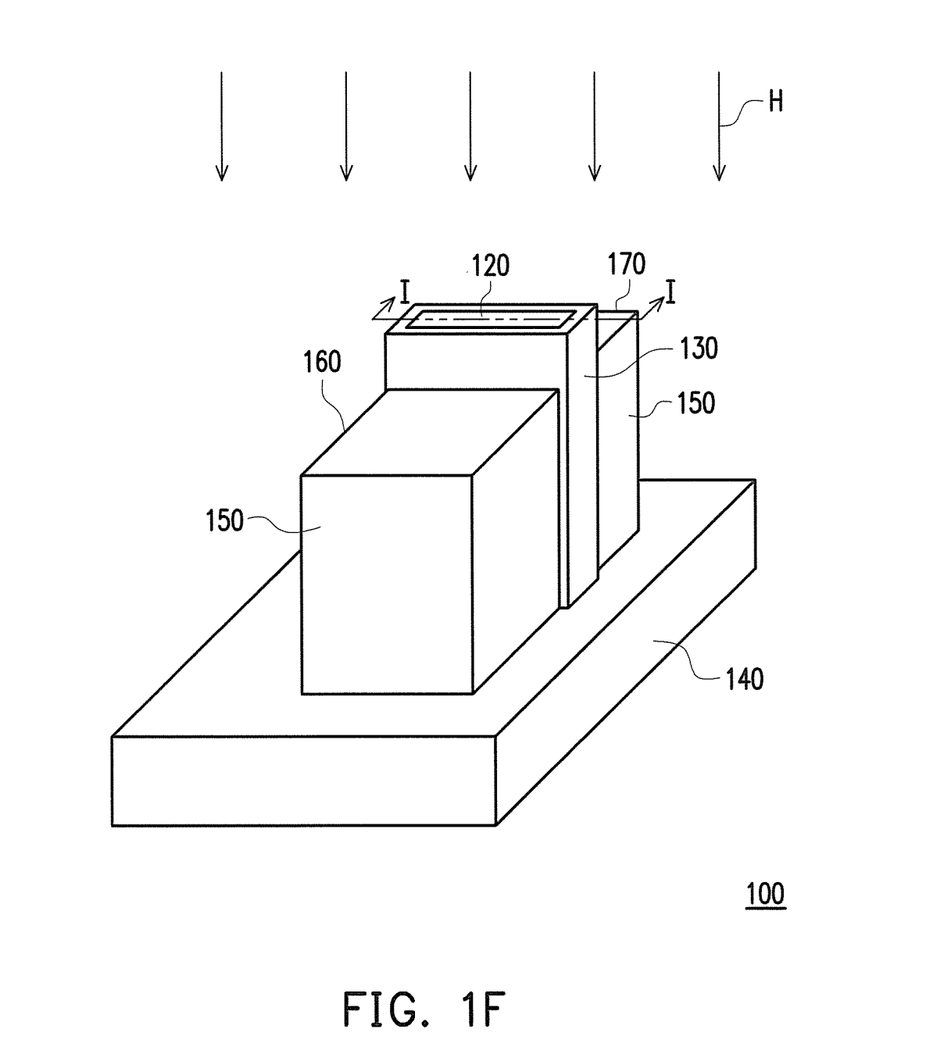
Figure 1G:
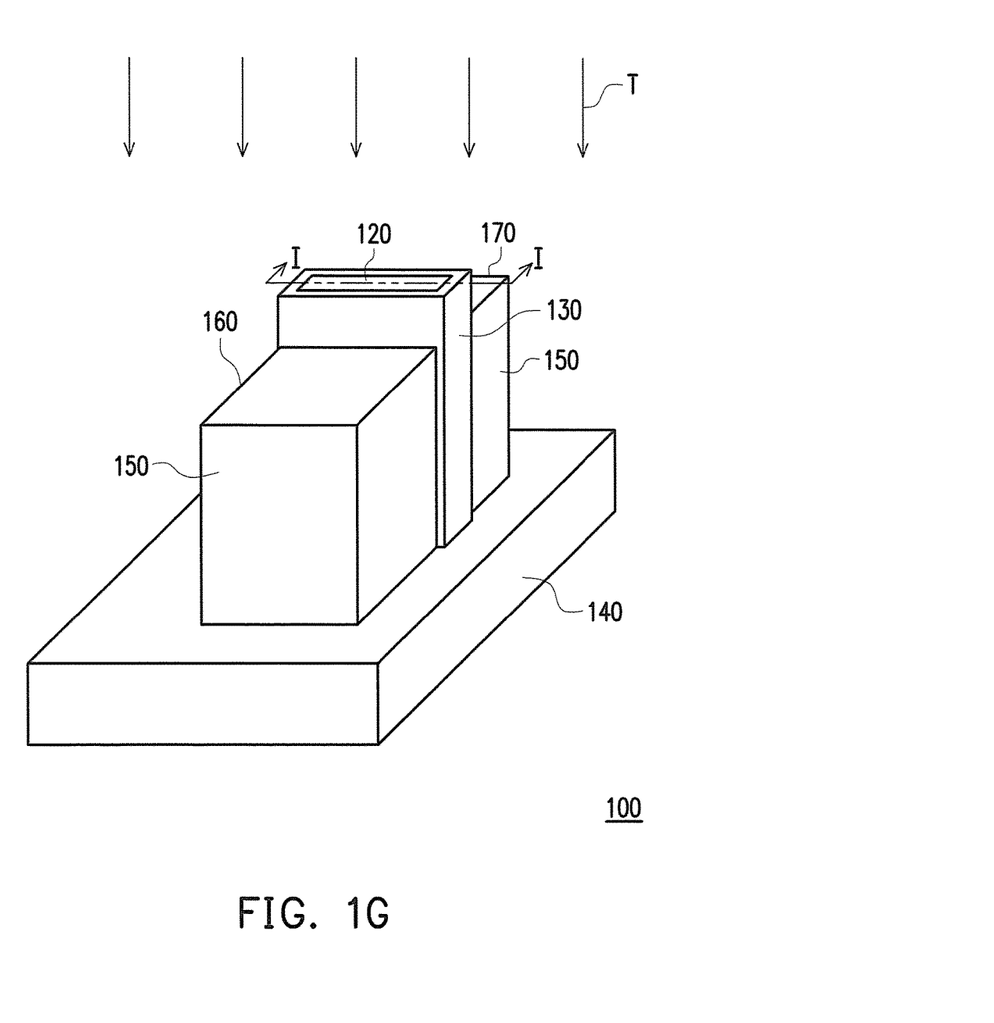

The manufacturing method of the transistor 100 described herein further includes a curing step H (as shown in FIG. 1F) which cures the shapable metal oxide layer 150 and a processing step T (as shown in FIG. 1G) which processes a portion of the shapable metal oxide layer 150 exposed by the fin-shaped gate 120 after inserting the fin-shaped gate 120 into the shapable metal oxide layer 150, so as to improve conductivity of the processed portion. Here, a method of curing the shapable metal oxide layer 150 may include thermal curing or photocuring, for instance. According to the present embodiment, the step of curing the shapable metal oxide layer 150 is performed prior to the step of processing the portion of the shapable metal oxide layer 150 exposed by the fin-shaped gate 120, so as to improve the conductivity of the processed portion. Alternatively, the step of processing the portion of the shapable metal oxide layer 150 exposed by the fin-shaped gate 120 may be performed to improve the conductivity of the processed portion, and the step of curing the shapable metal oxide layer 150 is then carried out. The order of performing said two steps is not limited in the present embodiment.

According to the present embodiment of the invention, the step of processing the portion of the shapable metal oxide layer 150 exposed by the fin-shaped gate 120 to increase the conductivity of the portion of the shapable metal oxide layer 150 includes transforming the portion of the shapable metal oxide layer 150 exposed by the fin-shaped gate 120 into a conductor; here, the step of processing the portion of the shapable metal oxide layer 150 exposed by the fin-shaped gate 120 to increase the conductivity of the portion of the shapable metal oxide layer 150 may be processing the portion of the shapable metal oxide layer 150 exposed by the fin-shaped gate 120 through plasma treatment, insulation layer covering treatment, or ion implantation. In case of the plasma treatment, argon (Ar) plasma is employed to remove some oxygen ions of the shapable metal oxide layer 150; thereby, vacancies may be generated in the shapable metal oxide layer 150, and the portion of the shapable metal oxide layer 150 becomes a conductor, e.g., becomes the source 160 and the drain 170. Besides, the portion of the shapable metal oxide layer 150 wrapped by the fin-shaped gate 120 becomes the active portion 180 and may serve as the channel of the FinFET. Thereby, the transistor 100 can be formed.

In view of the above, the fin-shaped gate 120 having the groove 122 is inserted into the shapable metal oxide layer 150, the portion of the shapable metal oxide layer 150 exposed by the fin-shaped gate 120 is cured, and the conductivity of the portion of the shapable metal oxide layer 150 exposed by the fin-shaped gate 120 is increased; thereby, the FinFET characterized by great performance may be formed by performing simple manufacturing steps.

Figure 2:
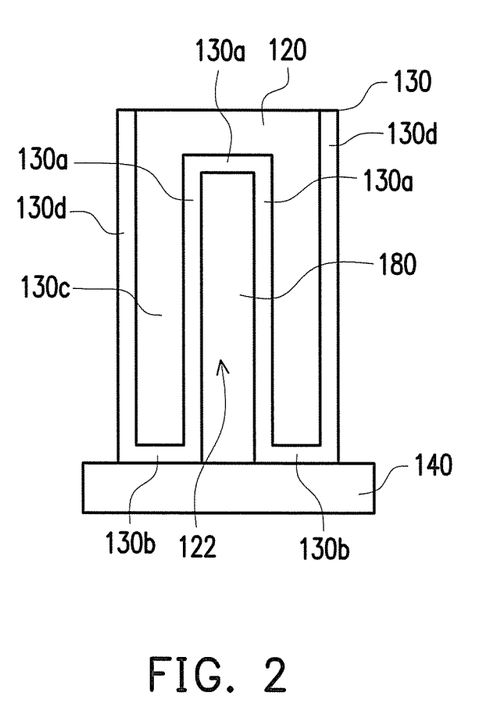
FIG. 2 is a cross-sectional diagram illustrating the transistor depicted in FIG. 1D along a line I-I.

FIG. 2 is a cross-sectional diagram illustrating the transistor depicted in FIG. 1D along a line I-I. Please refer to FIG. 1D and FIG. 2. In the present embodiment, the transistor 100 includes a substrate 140, a source 160, a drain 170, an active portion 180, a fin-shaped gate 120, and an insulation layer 130. The source 160 is located on the substrate 140. The drain 170 is located on the substrate 140. The active portion 180 connects the source 160 and the drain 170. A material of the source 160, the drain 170, and the active portion 180 includes a metal oxide semiconductor, and the active portion 180 is made of IGZO formed by performing a sol-gel process, for instance. The source 160 and the drain 170 are made of a material that undergoes the process for increasing the conductivity after IGZO is formed by performing the sol-gel process. In the present embodiment, the active portion 180, the source 160, and the drain 170 respectively have metal elements with individual molar percentages, an absolute value of a difference between the maximum molar percentage of one of the metal elements (e.g., indium, gallium, or zinc) of the active portion 180 and the maximum molar percentage of one of the metal elements of the source 160 is smaller than 1%, and an absolute value of a difference between the maximum molar percentage of the one of the metal elements of the active portion 180 and the maximum molar percentage of one of the metal elements of the drain 170 is smaller than 1% as well.

In this embodiment, a material of the fin-shaped gate 120 includes metal, e.g., aluminum, and the fin-shaped gate 120 wraps the active portion 180. The fin-shaped gate 120 may further include a groove 122, an opening located at a top portion of the groove 122 faces the substrate 140, and the source 160 and the drain 170 are respectively connected to two opposite sides of the active portion 180.

Besides, the insulation layer 130 may be made by CVD, ALD, or sputtering. A material of the insulation layer 130 includes oxide, e.g., aluminum oxide. A first portion 130a of the insulation layer 130 separates the fin-shaped gate 120 from the active portion 180, a second portion 130b of the insulation layer 130 separates the fin-shaped gate 120 from the substrate 140, a third portion 130c of the insulation layer 130 separates the fin-shaped gate 120 from the source 160 and from the drain 170, and a fourth portion 130d of the insulation layer 130 is located on a surface of the fin-shaped gate 120 facing away from the active portion 180. Here, the insulation layer 130 is integrally formed. Namely, the transistor 100 described herein is formed by placing the fin-shaped gate 120 in an upside down manner and inserting the fin-shaped gate 120 into the shapable metal oxide layer 150; accordingly, the insulation layer 130 may be integrally formed, which ensures the simplicity of the manufacturing process and the resultant structure.

As described in the previous embodiments, the fin-shaped gate 120 having the groove 122 wraps the active portion 180, so as to reduce the channel length and increase the current; thereby, the capability of the fin-shaped gate for controlling the channel can be enhanced, and the current leakage caused by the short channel effects can be reduced.

Figure 3A:
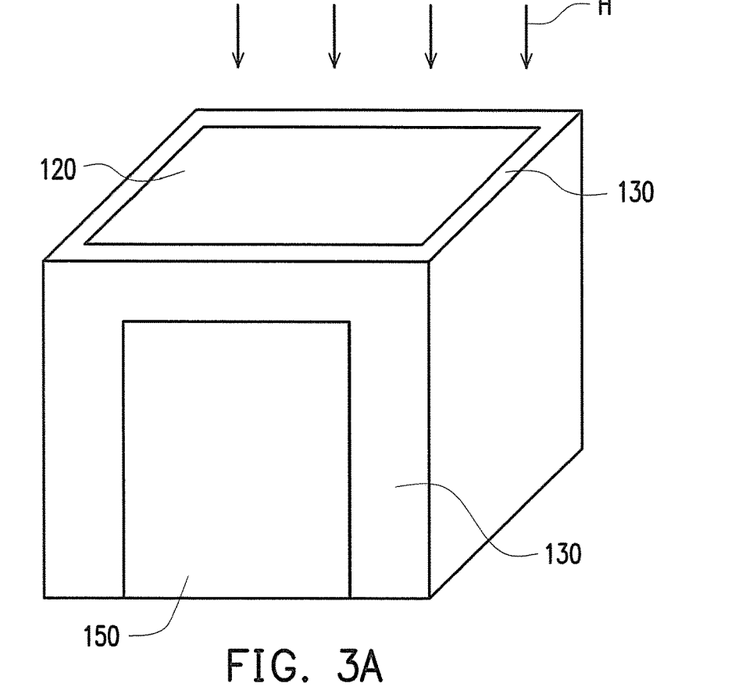
FIG. 3A and FIG. 3B are schematic diagrams illustrating a portion of the shapeable metal oxide layer overlapping with the fin-shape gate before a performing curing step.
Figure 3B:
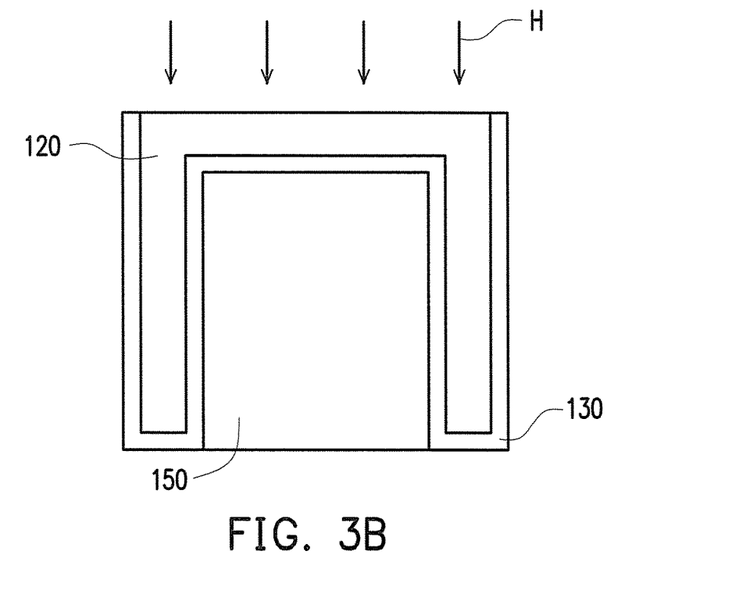

FIG. 3A and FIG. 3B are schematic diagrams illustrating a portion of the shapeable metal oxide layer overlapping with the fin-shape gate before a performing curing step, wherein FIG. 3B is a cross-sectional view of the portion. Please refer to FIG. 3A and FIG. 3B. In the present embodiment, after inserting the fin-shaped gate 120 into the shapable metal oxide layer 150 (i.e., the partially cured sol-gel), a portion of the shapeable metal oxide layer 150 is overlapped with the fin-shape gate 120 (i.e., the portion of the shapable metal oxide layer 150 filling the groove 122), and then the curing step H is performed to cure the shapable metal oxide layer 150. It is to be noted that, as the shapeable metal oxide layer 150 being cured, the volume of the shapeable metal oxide layer 150 to be cured will decrease. Such decrease in volume may generate a gap between the completely cured shapeable metal oxide layer 150 and the insulation layer 130 directly contacted by the completely cured shapeable metal oxide layer 150, and a poor contact may take place. However, the level of shrinkage relates to a cohesive force and a surface adhesive force of the shapeable metal oxide layer 150 (e.g., the adhesive force between the shapeable metal oxide layer 150 and the insulation layer 130 directly contacted by the shapeable metal oxide layer 150). Examples are described in the following to show how the cohesive force and the surface adhesive force of the shapeable metal oxide layer 150 can affect the level of shrinkage in the shapeable metal oxide layer 150 after the curing step H.

Figure 3C:
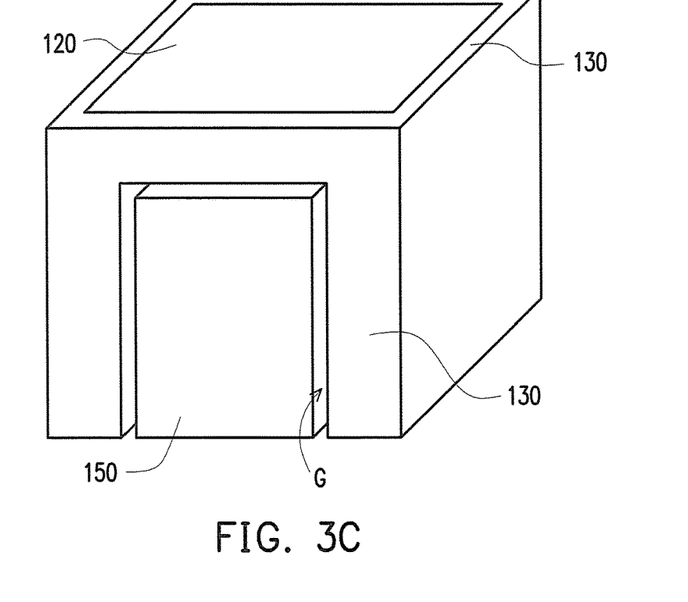
FIG. 3C and FIG. 3D are schematic diagrams illustrating the portion of the shapeable metal oxide layer overlapping with the fin-shape gate, after performing the curing step, under a condition that a surface adhesive force of the shapeable metal oxide layer is less than a cohesive force of the shapeable metal oxide layer.
Figure 3D:
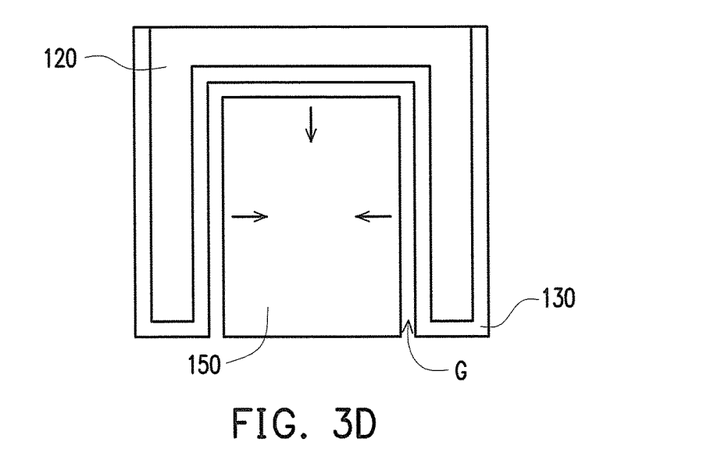

FIG. 3C and FIG. 3D are schematic diagrams illustrating the portion of the shapeable metal oxide layer overlapping with the fin-shape gate, after performing the curing step, under a condition that a surface adhesive force of the shapeable metal oxide layer is less than a cohesive force of the shapeable metal oxide layer, wherein FIG. 3D is a cross-sectional view of the portion. Referring to FIG. 3C and FIG. 3D, when the adhesive force between the shapeable metal oxide layer 150 and the insulation layer 130 directly contacted by the shapeable metal oxide layer 150 is less than the cohesive force of the shapeable metal oxide layer 150, the contact between the shapeable metal oxide layer 150 and the insulation layer 130 is poor, thus, after the curing step H is performed, a severe shrinkage may occur and causes the shapeable metal oxide layer 150 to shrink away from the insulation layer 130, thereby generating a gap G between the shapeable metal oxide layer 150 and the insulation layer 130.

Figure 3E:
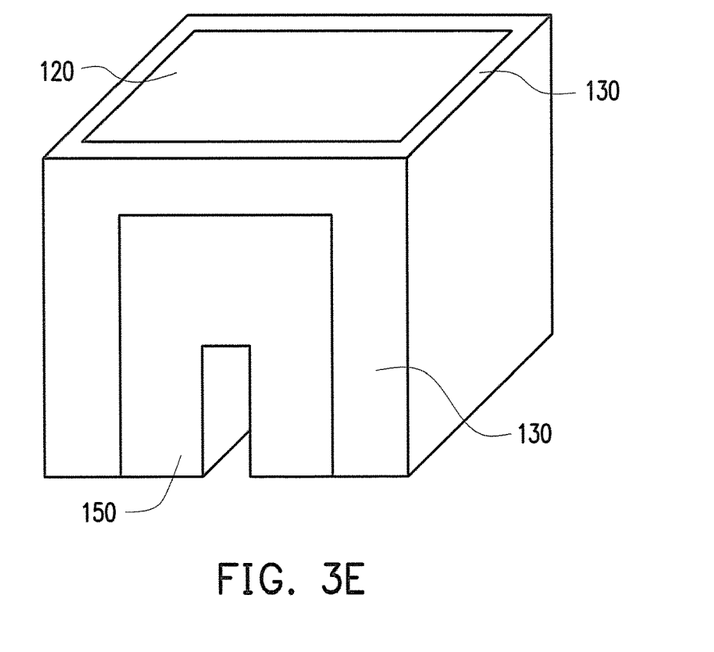
FIG. 3E and FIG. 3F are schematic diagrams illustrating the portion of the shapeable metal oxide layer overlapping with the fin-shape gate, after performing the curing step, under a condition that a surface adhesive force of the shapeable metal oxide layer is greater than a cohesive force of the shapeable metal oxide layer.
Figure 3F:
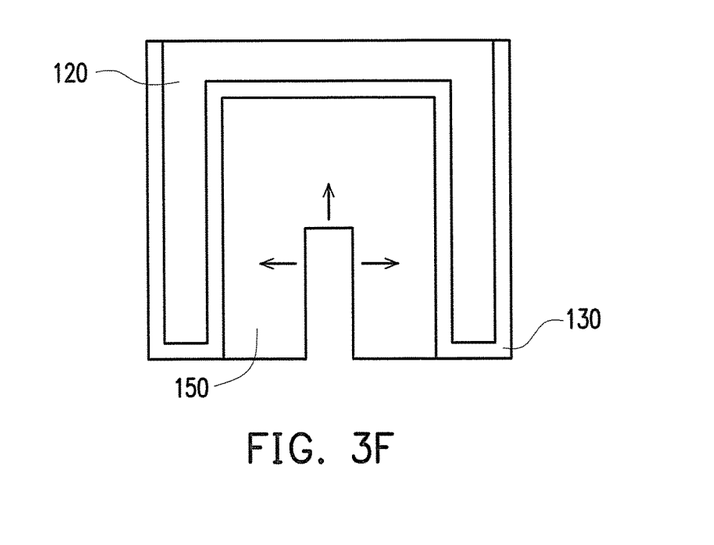

FIG. 3E and FIG. 3F are schematic diagrams illustrating the portion of the shapeable metal oxide layer overlapping with the fin-shape gate, after performing the curing step, under a condition that a surface adhesive force of the shapeable metal oxide layer is greater than a cohesive force of the shapeable metal oxide layer, wherein FIG. 3F is a cross-sectional view of the portion. Referring to FIG. 3E and FIG. 3F, when the adhesive force between the shapeable metal oxide layer 150 and the insulation layer 130 directly contacted by the shapeable metal oxide layer 150 is greater than the cohesive force of the shapeable metal oxide layer 150, the contact between the shapeable metal oxide layer 150 and the insulation layer 130 is strong; thus, after the curing step H is performed, a minor shrinkage may occur and the shapeable metal oxide layer 150 is still in direct contact with the insulation layer 130. That is, the shrinkage may only occur at a region of the shapeable metal oxide layer 150 that is not adhered to the insulation layer 130 (e.g., the region having a higher degree of freedom in shrinkage), but not at a region of the shapeable metal oxide layer 150 that is adhered to the insulation layer 130 (e.g., the region having a lower degree of freedom), because the adhesive force between the shapeable metal oxide layer 150 and the insulation layer 130 is greater than the cohesive force of the shapeable metal oxide layer 150. As a result, even if a shrinkage occurs after performing the curing step H, the level of such shrinkage is too small to damage the direct contact between the shapeable metal oxide layer 150 and the insulation layer 130.

In the present embodiment, the adhesive force between the shapeable metal oxide layer 150 and the insulation layer 130 directly contacted by the shapeable metal oxide layer 150 is greater than the cohesive force of the shapeable metal oxide layer 150, as shown in FIG. 3E and FIG. 3F, so that the contact between the shapeable metal oxide layer 150 and the insulation layer 130 is favorable. Thus, after performing the curing step H, the completely cured shapeable metal oxide layer 150 is still in direct contact with the insulation layer 130, and the generation of a gap between the shapeable metal oxide layer 150 and the insulation layer 130 is avoided.

To sum up, according to the manufacturing method of the transistor described herein, the fin-shaped gate having the groove is inserted into the shapable metal oxide layer, the shapable metal oxide layer is cured, and the conductivity of the portion of the shapable metal oxide layer exposed by the fin-shaped gate is increased; as such, the FinFET characterized by great performance may be formed by performing simple manufacturing steps.

Moreover, the transistor described herein includes the fin-shaped gate that has the groove and wraps the active portion, so as to reduce the channel length and increase the current; thereby, the capability of the gate for controlling the channel can be enhanced, the current leakage caused by the short channel effects can be reduced, and the resultant transistor can then be formed with ease.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:
1. A manufacturing method of a transistor, comprising:
   providing a base;
   forming a fin-shaped gate on the base;
   covering the fin-shaped gate with an insulation layer;
   providing a substrate;
   forming a partially cured sol-gel on the substrate;
   inserting the fin-shaped gate into the partially cured sol-gel, so that a portion of the fin-shaped gate is uncovered by the partially cured sol-gel;
   after inserting the fin-shaped gate into the partially cured sol-gel, curing the partially cured sol-gel; and
   processing a portion of the partially cured sol-gel not overlapping with the fin-shaped gate to increase conductivity of the portion of the partially cured sol-gel.
2. The manufacturing method according to claim 1, further comprising:
   removing the base after inserting the fin-shaped gate into the partially cured sol-gel.
3. The manufacturing method according to claim 1, wherein the fin-shaped gate has a groove, and the step of inserting the fin-shaped gate into the partially cured sol-gel comprises:
   placing the fin-shaped gate in an upside-down manner; and
   causing an opening located at a top portion of the groove of the fin-shaped gate to face the partially cured sol-gel and inserting the fin-shaped gate into the partially cured sol-gel.

4. The manufacturing method according to claim 3, wherein the groove is filled with a material of the partially cured sol-gel after the fin-shaped gate is inserted into the partially cured sol-gel.

5. The manufacturing method according to claim 1, wherein the step of processing the portion of the partially cured sol-gel not overlapping with the fin-shaped gate to increase the conductivity of the portion of the partially cured sol-gel comprises transforming the portion of the partially cured sol-gel not overlapping with the fin-shaped gate into a conductor.

6. The manufacturing method according to claim 1, wherein the step of processing the portion of the partially cured sol-gel not overlapping with the fin-shaped gate to increase the conductivity of the portion of the partially cured sol-gel not overlapping with the fin-shaped gate comprises processing the partially cured sol-gel not overlapping with the fin-shaped gate through plasma treatment.

7. The manufacturing method according to claim 1, wherein the step of processing the portion of the partially cured sol-gel not overlapping with the fin-shaped gate to increase the conductivity of the portion of the partially cured sol-gel not overlapping with the fin-shaped gate comprises processing the portion of the partially cured sol-gel not overlapping with the fin-shaped gate through insulation layer covering treatment.

8. The manufacturing method according to claim 1, wherein the step of processing the portion of the partially cured sol-gel not overlapping with the fin-shaped gate to increase the conductivity of the portion of the partially cured sol-gel overlapping with the fin-shaped gate comprises processing the portion of the partially cured sol-gel not overlapping with the fin-shaped gate through ion implantation.

9. The manufacturing method according to claim 1, wherein the curing the partially cured sol-gel comprises thermal curing.

* * * * *